United States Patent
Chiu et al.

(10) Patent No.: US 9,466,552 B2
(45) Date of Patent: Oct. 11, 2016

(54) VERTICAL SEMICONDUCTOR DEVICE HAVING A NON-CONDUCTIVE SUBSTRATE AND A GALLIUM NITRIDE LAYER

(75) Inventors: Chien-Wei Chiu, Beigang Township, Yunlin County (TW); Tsung-Yi Huang, Hsinchu (TW)

(73) Assignee: RICHTEK TECHNOLOGY CORPORATION, Chupei, Hsin-Chu (TW)

( * ) Notice: Subject to any disclaimer, the term of this patent is extended or adjusted under 35 U.S.C. 154(b) by 406 days.

(21) Appl. No.: 13/436,665

(22) Filed: Mar. 30, 2012

(65) Prior Publication Data

US 2013/0256680 A1  Oct. 3, 2013

(51) Int. Cl.
| | |
|---|---|
| *H01L 29/24* | (2006.01) |
| *H01L 21/331* | (2006.01) |
| *H01L 21/329* | (2006.01) |
| *H01L 23/48* | (2006.01) |
| *H01L 29/66* | (2006.01) |
| *H01L 29/732* | (2006.01) |
| *H01L 29/739* | (2006.01) |
| *H01L 29/872* | (2006.01) |
| *H01L 29/20* | (2006.01) |

(52) U.S. Cl.
CPC ......... *H01L 23/481* (2013.01); *H01L 29/6631* (2013.01); *H01L 29/66212* (2013.01); *H01L 29/66333* (2013.01); *H01L 29/732* (2013.01); *H01L 29/7395* (2013.01); *H01L 29/872* (2013.01); *H01L 29/2003* (2013.01); *H01L 2924/0002* (2013.01)

(58) Field of Classification Search
CPC ... H01L 29/24; H01L 21/331; H01L 23/481; H01L 29/66212; H01L 29/7395; H01L 29/66333; H01L 29/6631; H01L 29/2003; H01L 29/732
USPC .......................................................... 25/471
See application file for complete search history.

(56) References Cited

U.S. PATENT DOCUMENTS

| | | | | |
|---|---|---|---|---|
| 6,768,146 | B2* | 7/2004 | Yoshida | H01L 21/28575 257/279 |
| 7,569,920 | B2* | 8/2009 | Otremba et al. | 257/686 |
| 7,679,104 | B2* | 3/2010 | Sato | H01L 29/0657 257/190 |
| 8,823,089 | B2* | 9/2014 | Schulze | H01L 29/1606 257/24 |
| 2003/0042525 | A1* | 3/2003 | Tanaka | 257/302 |
| 2007/0030871 | A1* | 2/2007 | Lee | 372/46.01 |
| 2011/0266683 | A1* | 11/2011 | Feng | 257/773 |
| 2012/0061686 | A1* | 3/2012 | Nishiguchi et al. | 257/77 |

\* cited by examiner

*Primary Examiner* — Thomas L Dickey
*Assistant Examiner* — Damon Hillman
(74) *Attorney, Agent, or Firm* — Tung & Associates

(57) ABSTRACT

The present invention discloses a vertical semiconductor device and a manufacturing method thereof. The vertical semiconductor device includes: a substrate having a first surface and a second surface, the substrate including a conductive array formed by multiple conductive plugs through the substrate; a semiconductor layer formed on the first surface, the semiconductor layer having a third surface and a fourth surface, wherein the fourth surface faces the first surface; a first electrode formed on the third surface; and a second electrode formed on the second surface for electrically connecting to the conductive array.

2 Claims, 4 Drawing Sheets

VERTICAL SEMICONDUCTOR DEVICE HAVING A NON-CONDUCTIVE SUBSTRATE AND A GALLIUM NITRIDE LAYER

BACKGROUND OF THE INVENTION

1. Field of Invention

The present invention relates to a vertical semiconductor device and a manufacturing method of a vertical semiconductor device; particularly, it relates to such vertical semiconductor device and manufacturing method wherein the current crowding phenomenon of a device is mitigated.

2. Description of Related Art

Conventionally, gallium nitride (GaN) crystal epitaxial growth is performed on a silicon carbide (SiC) substrate or a sapphire substrate. Sapphire is an insulating material, so if a power device is to be manufactured on the sapphire substrate, it has to be formed laterally; that is, the electrodes of the power device are formed on the same side of the substrate. This increases the area of the power device and the manufacturing cost, and also induces the current crowding problem.

To overcome the drawback in the prior art, the present invention proposes a vertical semiconductor device and a manufacturing method thereof which decrease the device area such that the manufacturing cost is decreased, and mitigate the current crowding problem.

SUMMARY OF THE INVENTION

A first objective of the present invention is to provide a vertical semiconductor device.

A second objective of the present invention is to provide a manufacturing method of a vertical semiconductor device.

To achieve the objectives mentioned above, from one perspective, the present invention provides a vertical semiconductor device, including: a substrate having a first surface and a second surface facing opposite directions, the substrate including a conductive array formed by a plurality of conductive plugs through the substrate; a semiconductor layer formed on the first surface, the semiconductor layer having a third surface and a fourth surface facing opposite directions, wherein the fourth surface faces the first surface; a first electrode formed on the third surface; and a second electrode formed on the second surface, for electrically connecting to the conductive array.

From another perspective, the present invention provides a manufacturing method of a vertical semiconductor device, including: providing a substrate, which has a first surface and a second surface facing opposite directions; forming a semiconductor layer on the first surface, which has a third surface and a fourth surface facing opposite directions, wherein the fourth surface faces the first surface; forming a first electrode on the third surface; forming a plurality of holes through the substrate, the holes forming a hole array; forming a plurality of conductive plugs in the holes to form a conductive array; and forming a second electrode on the second surface for electrically connecting to the conductive array.

In one embodiment, the substrate preferably includes a silicon carbide (SiC) substrate or a sapphire substrate.

In the aforementioned embodiment, the semiconductor layer preferably includes a gallium nitride (GaN) layer, and the first electrode, the GaN layer, the conductive array, and the second electrode form a vertical Schottky barrier diode (SBD).

In another embodiment, the semiconductor layer preferably includes: a GaN layer doped with first conductive type impurities; a base region doped with second conductive type impurities, the base region being formed in the GaN layer and electrically connected to the first electrode; and an emitter region doped with first conductive type impurities, the emitter region being formed in the base region and electrically connected to a third electrode which is formed on the third surface; wherein the first electrode, the semiconductor layer, the third electrode, the conductive array, and the second electrode form a vertical bipolar junction transistor (BJT).

In another preferable embodiment, the semiconductor layer includes: a GaN layer doped with first conductive type impurities; a body region doped with second conductive type impurities, the body region being formed in the GaN layer and electrically connected to the first electrode; an emitter region doped with first conductive type impurities, the emitter region being formed in the body region and electrically connected to the first electrode; and an injection region doped with second conductive type impurities, the injection region being formed between the GaN layer and the substrate, and being electrically connected to the second electrode by the conductive array. And, the vertical semiconductor device further includes: a dielectric layer formed on the third surface; and a gate formed on the dielectric layer. Thus, the first electrode, the semiconductor layer, the conductive array, the second electrode, the dielectric layer, and the gate form a vertical insulated gate bipolar transistor (IGBT).

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the regions and the process steps, but not drawn according to actual scale.

Figure 1A:
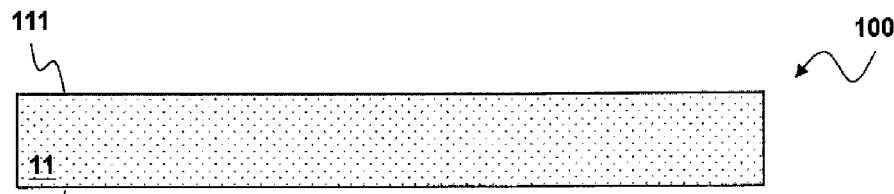
FIGS. 1A-1D show a first embodiment of the present invention.

FIGS. 1A-1D show a first embodiment of the present invention. FIGS. 1A-1D are schematic cross-section diagrams showing a manufacturing flow of a Schottky barrier diode (SBD) 100 according to this embodiment. As shown in FIG. 1A, first, a substrate 11 is provided, which has an upper surface 111 and a lower surface 112. The substrate 11 for example is but not limited to a silicon carbide (SiC) substrate or a sapphire substrate.

Figure 1B:
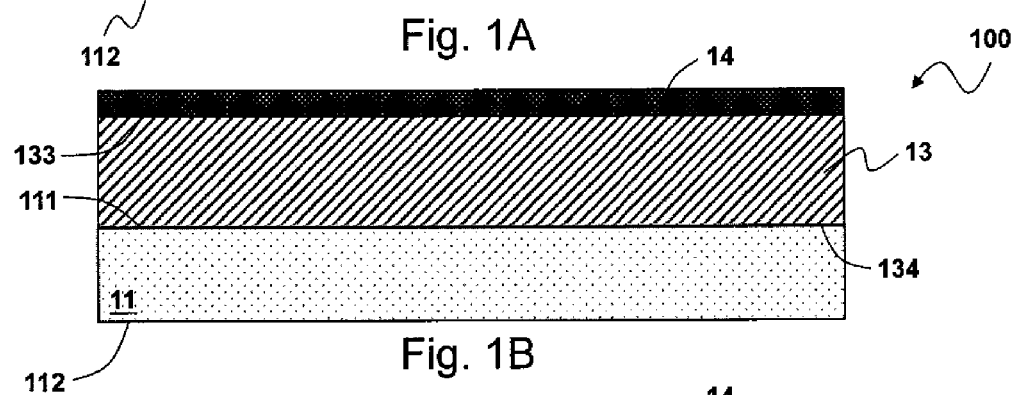

Next, referring to FIG. 1B, a semiconductor layer 13 is formed on the upper surface 111. The semiconductor layer 13 has an upper surface 133 and a lower surface 134, wherein the lower surface 134 faces the upper surface 111. The semiconductor layer 13 is for example but not limited to a gallium nitride (GaN) layer. Next, an anode 14 is formed on the upper surface 133, wherein a Schottky contact is formed between the anode 14 and the semiconductor layer 13.

Figure 1C:
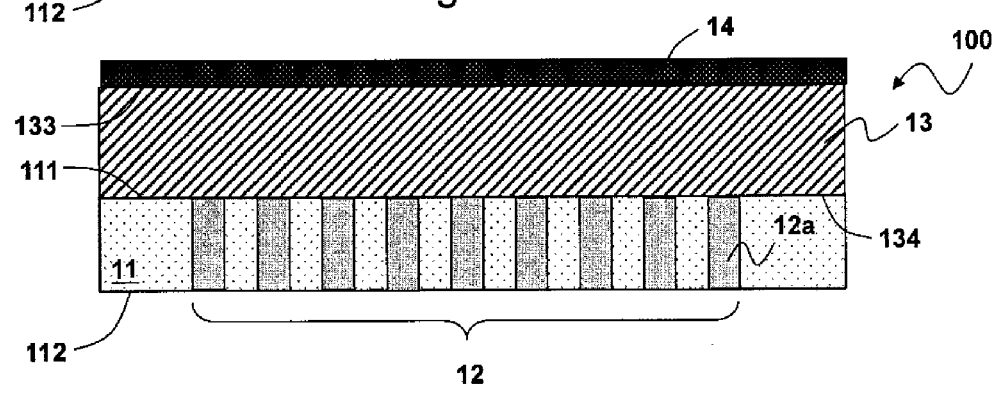
Figure 1D:
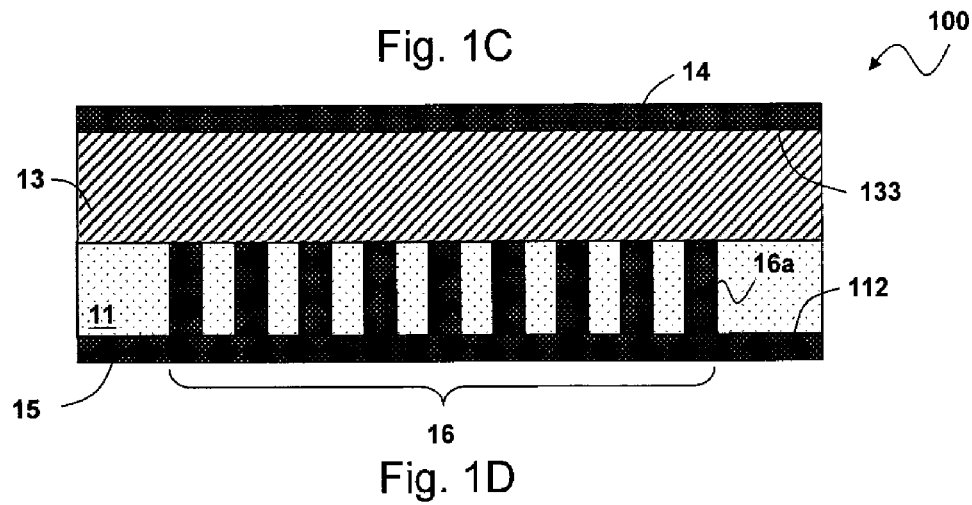

Next, as shown in FIG. 1C, multiple holes 12a are formed through the substrate 11 between the upper surface 111 and the lower surface 112, by for example but not limited to a laser etching technology. The multiple holes 12a form a hole array 12 from top view (not shown). A conductive array 16 through the substrate 11 is formed by forming multiple conductive plugs 16a in the holes 12a. Then a cathode 15 is formed on the lower surface 112 for electrically connecting to the conductive array 16. An Ohmic contact is formed between the conductive array 16 and the semiconductor layer 13. Thus, the anode 14, the semiconductor layer 13, the conductive array 16, and the cathode 15 form the vertical SBD 100.

Figure 2A:
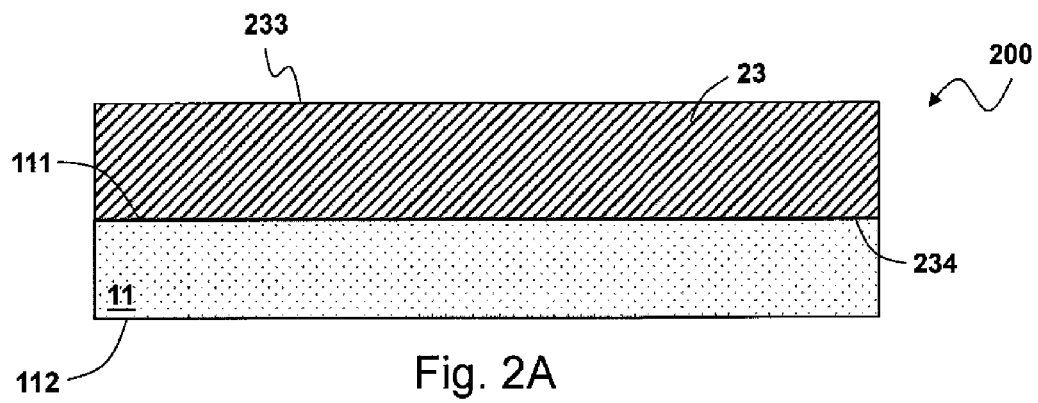
FIGS. 2A-2D show a second embodiment of the present invention.

FIGS. 2A-2D show a second embodiment of the present invention. FIGS. 2A-2D are schematic cross-section diagrams showing a manufacturing flow of a bipolar junction transistor (BJT) 200 according to this embodiment. As shown in FIG. 2A, similar to the first embodiment, first, a substrate 11 is provided, which has an upper surface 111 and a lower surface 112. The substrate 11 for example is but not limited to a silicon carbide (SiC) substrate or a sapphire substrate. Next, a semiconductor layer 23 is formed on the upper surface 111. The semiconductor layer 23 includes an upper surface 233 and a lower surface 234, and the lower surface 234 faces the upper surface 111. The semiconductor layer 23 is for example but not limited to a GaN layer. This embodiment is different from the first embodiment in that, the semiconductor layer 23 is doped with first conductive type impurities. The first conductive type is for example but not limited to N-type.

Figure 2B:
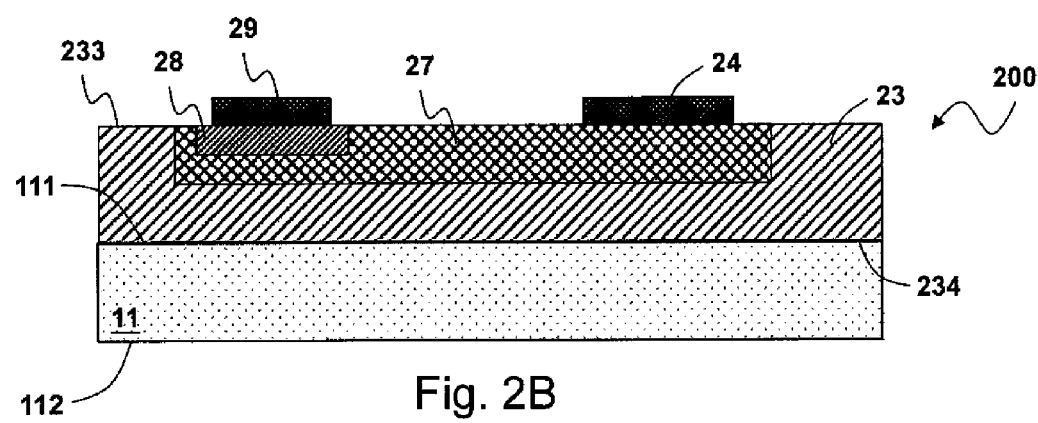

Next, referring to FIG. 2B, a base region 27 doped with second conductive type impurities is formed in the semiconductor layer 23 beneath the upper surface 233. The second conductive type is for example but not limited to P-type. Next, a base 24 is formed on the upper surface 233. The base 24 is electrically connected to the base region 27. An emitter region 28 doped with first conductive type (for example N-type) impurities is formed in the base region 27 beneath the upper surface 233. An emitter 29 is formed on the upper surface 233, which is electrically connected to the emitter region 28.

Figure 2C:
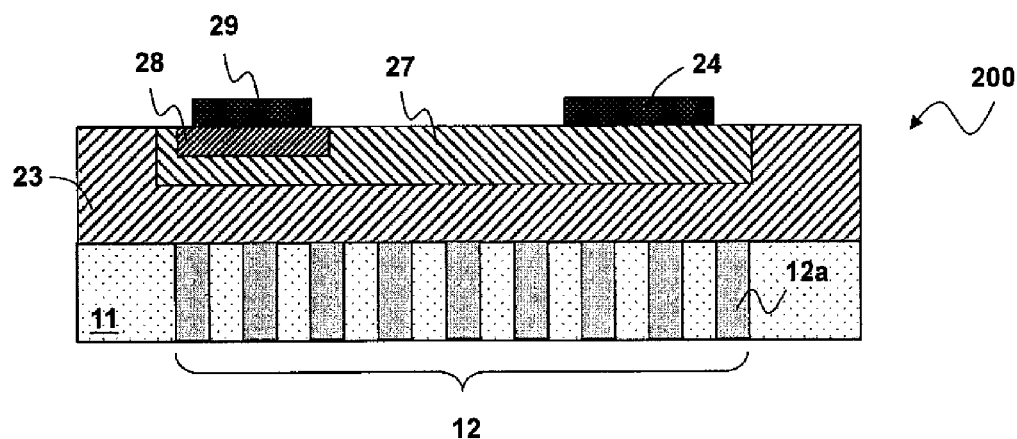

As shown in FIG. 2C, multiple holes 12a are formed through the substrate 11 between the upper surface 111 and the lower surface 112, by for example but not limited to a laser etching technology. The multiple holes 12a form a hole array 12 from top view (not shown).

Figure 2D:
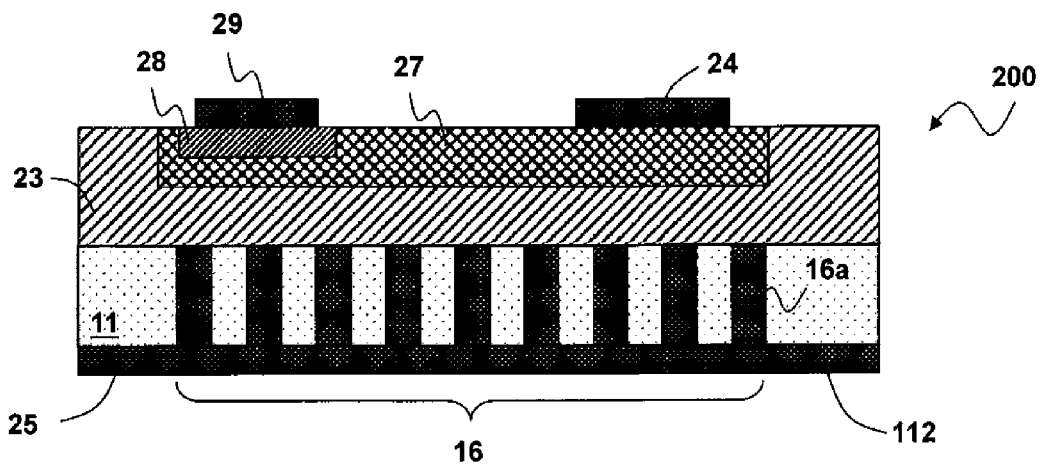

Next, referring to FIG. 2D, a conductive array 16 through the substrate 11 is formed by forming multiple conductive plugs 16a in the holes 12a. Next, a collector 25 is formed on the lower surface 112, which is electrically connected to the conductive array 16. An Ohmic contact is formed between the conductive array 16 and the semiconductor layer 23. Thus, the base region 27, the base 28, the emitter 29, the semiconductor layer 23, the conductive array 16, and the collector 25 form the vertical BJT 200.

Figure 3A:
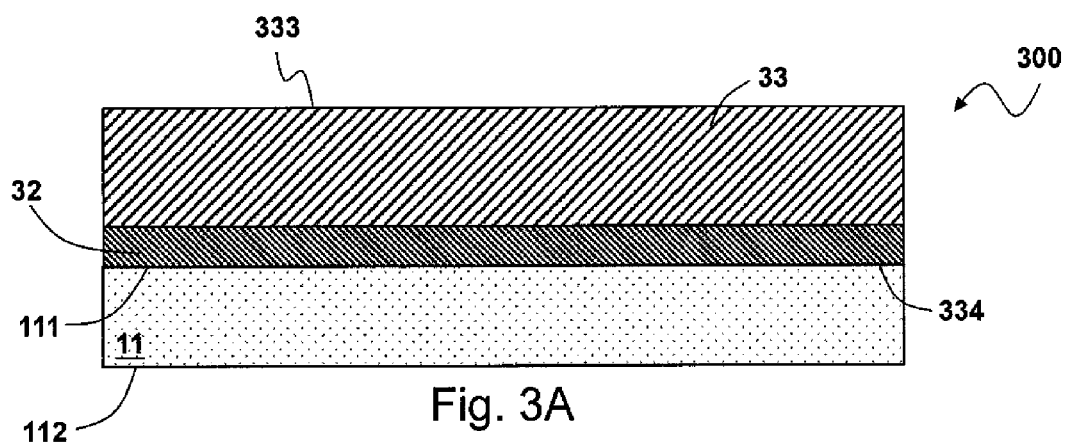
FIGS. 3A-3D show a third embodiment of the present invention.

FIG. 3A-3D show a third embodiment of the present invention. FIGS. 3A-3D are schematic cross-section diagrams showing a manufacturing flow of an insulated gate bipolar transistor (IGBT) 300 according to this embodiment. As shown in FIG. 3A, similar to the second embodiment, first, a substrate 11 is provided, which has an upper surface 111 and a lower surface 112. The substrate 11 for example is but not limited to a SiC substrate or a sapphire substrate. Next, semiconductor layers 32 and 33 are formed on the upper surface 111. The semiconductor layer 33 includes an upper surface 333, and the semiconductor layer 32 includes a lower surface 334, and the lower surface 334 faces the upper surface 111. The semiconductor layers 32 and 33 are for example but not limited to GaN layers. This embodiment is different from the second embodiment in that, the semiconductor layer 33 is doped with first conductive type impurities, and the semiconductor layer 32 is doped with second conductive type impurities. The first conductive type is for example but not limited to N-type and the second conductive type is for example but not limited to P-type; however, the first conductive type can be P-type and the second conductive type can be N-type.

Figure 3B:
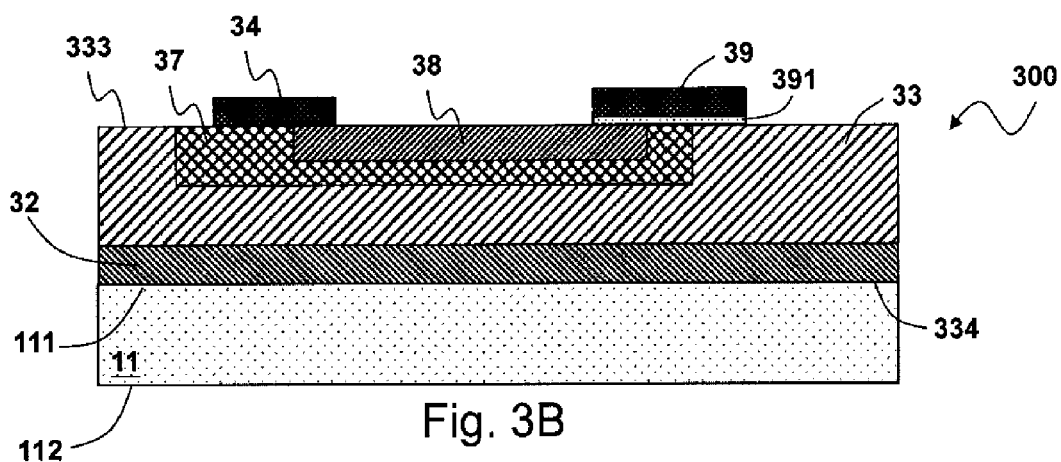

Next, referring to FIG. 3B, a body region 37 doped with second conductive type impurities is formed in the semiconductor layer 33 beneath the surface 333. Next, a body electrode 34 is formed on the upper surface 333 for electrically connecting to the body region 37. An emitter region 38 doped with first conductive type impurities is formed in the body region 37 beneath the upper surface 33. The emitter region is also electrically connected to the body electrode 34. Next, a dielectric layer 391 is formed on the upper surface 333, above portions of the semiconductor layer 33, the body region 37, and the emitter 38. Next, a gate 39 is formed on the dielectric layer 391.

Figure 3C:
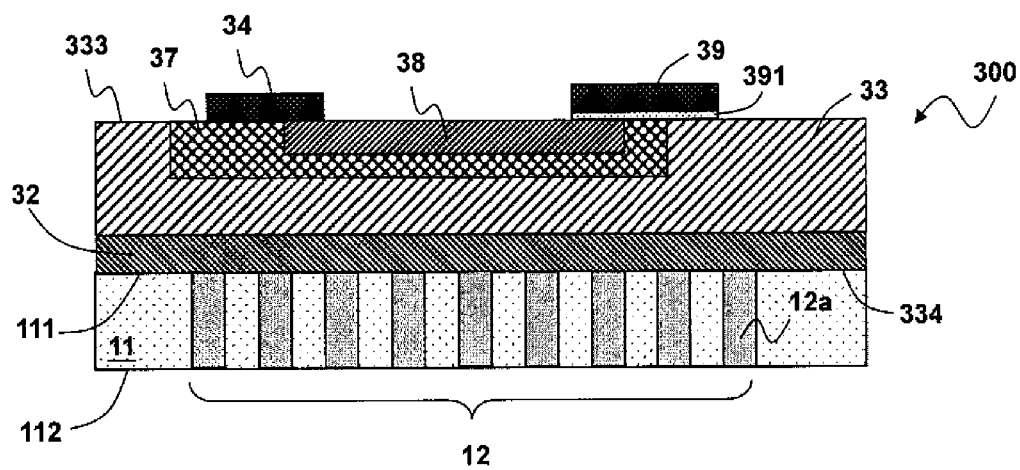

As shown in FIG. 3C, multiple holes 12a are formed through the substrate 11 between the upper surface 111 and the lower surface 112, by for example but not limited to the laser etching technology. The multiple holes 12a form a hole array 12 from top view (not shown).

Figure 3D:
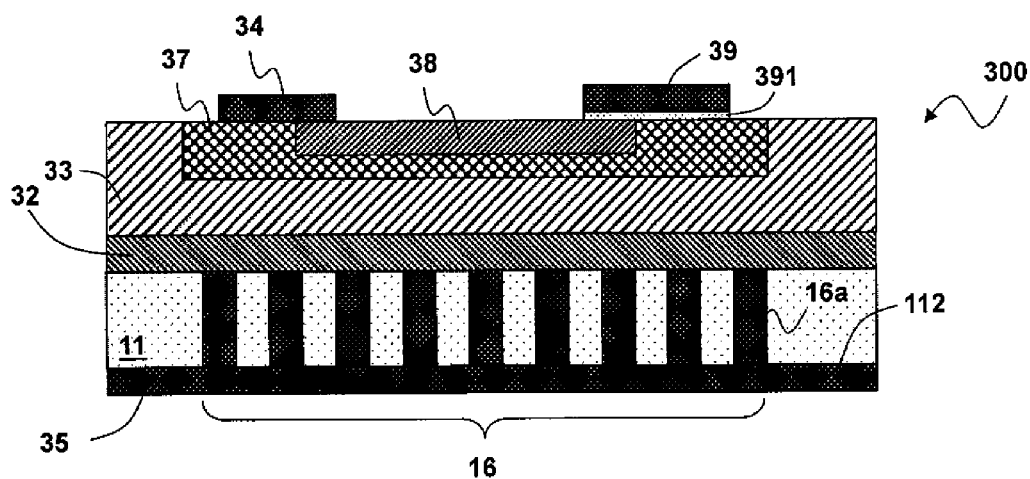

Next, referring to FIG. 3D, the conductive array 16 through the substrate 11 is formed by forming multiple conductive plugs 16a in the holes 12a. Next, a collector 35 is formed on the lower surface 112, which is electrically connected to the conductive array 16. An Ohmic contact is formed between the conductive array 16 and the semiconductor layer 32. Thus, the body electrode 34, the semiconductor layers 32 and 33, the gate 39, the dielectric layer 391, the conductive array 16, the body region 37, the emitter region 38, and the collector 35 form the vertical IGBT 300.

Note that the present invention forms vertical semiconductor devices by the conductive array 16 through the substrate 11. Comparing to the lateral semiconductor device, the vertical semiconductor device not only occupies less area and therefore decreases the manufacturing cost, but also mitigates the current crowding problem because the carriers flow vertically instead of laterally when the vertical semiconductor device operates.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristics of the device, such as an aluminum gallium nitride (AlGaN) layer between the semiconductor layer 13 and the anode 14 in the vertical SBD 100, can be added. For another example, the semiconductor layer 13 may be P-type or N-type in the SBD 100. In view of the foregoing, the spirit of the present invention should cover all such and other modifications and variations, which should be interpreted to fall within the scope of the following claims and their equivalents.

What is claimed is:

1. A vertical semiconductor device, comprising:
   a silicon carbide substrate or a sapphire substrate having a first surface and a second surface facing opposite directions;

a conductive array formed by a plurality of conductive plugs which extend from the first surface completely through the substrate to the second surface;

a semiconductor layer formed on and in contact with the first surface, the semiconductor layer having a third surface and a fourth surface facing opposite directions, wherein the fourth surface faces the first surface;

a first electrode formed on and in contact with the third surface; and a second electrode formed on and in contact with the second surface, for electrically connecting to the conductive array, wherein the semiconductor layer includes:

a GaN layer doped with first conductive type impurities;

a base region doped with second conductive type impurities, the base region being formed in the GaN layer and electrically connected to the first electrode; and an emitter region doped with first conductive type impurities, the emitter region being formed in the base region and electrically connected to a third electrode which is formed on the third surface;

wherein the first electrode, the semiconductor layer, the third electrode, the conductive array, and the second electrode form a vertical bipolar junction transistor (BJT).

2. A vertical semiconductor device, comprising:

a silicon carbide substrate or a sapphire substrate having a first surface and a second surface facing opposite directions;

a conductive array formed by a plurality of conductive plugs which extend from the first surface completely through the substrate to the second surface;

a semiconductor layer formed on and in contact with the first surface, the semiconductor layer having a third surface and a fourth surface facing opposite directions, wherein the fourth surface faces the first surface;

a first electrode formed on and in contact with the third surface; and a second electrode formed on and in contact with the second surface, for electrically connecting to the conductive array, wherein the semiconductor layer includes:

a GaN layer doped with first conductive type impurities;

a body region doped with second conductive type impurities, the body region being formed in the GaN layer and electrically connected to the first electrode;

an emitter region doped with first conductive type impurities, the emitter region being formed in the body region and electrically connected to the first electrode; and an injection region doped with second conductive type impurities, the injection region being formed between the GaN layer and the substrate, and being electrically connected to the second electrode by the conductive array;

and the vertical semiconductor device further includes:

a dielectric layer formed on the third surface; and a gate formed on the dielectric layer;

wherein the first electrode, the semiconductor layer, the conductive array, the second electrode, the dielectric layer, and the gate form a vertical insulated gate bipolar transistor (IGBT).

\* \* \* \* \*